US008841546B2

(12) United States Patent
Nam et al.

(10) Patent No.: US 8,841,546 B2
(45) Date of Patent: Sep. 23, 2014

(54) PASTE AND SOLAR CELL USING THE SAME

(75) Inventors: Jeongbeom Nam, Seoul (KR); Jinah Kim, Seoul (KR); Indo Chung, Seoul (KR); Sungjin Kim, Seoul (KR); Juhong Yang, Seoul (KR); Seunghwan Sim, Seoul (KR); Ilhyoung Jung, Seoul (KR); Hyoungjin Kwon, Seoul (KR)

(73) Assignee: LG Electronics Inc., Seoul (KR)

( * ) Notice: Subject to any disclaimer, the term of this patent is extended or adjusted under 35 U.S.C. 154(b) by 303 days.

(21) Appl. No.: 13/080,327

(22) Filed: Apr. 5, 2011

(65) Prior Publication Data
US 2011/0284067 A1    Nov. 24, 2011

(30) Foreign Application Priority Data
May 24, 2010  (KR) .................. 10-2010-0047991

(51) Int. Cl.
| | |
|---|---|
| H01B 1/08 | (2006.01) |
| H01B 1/16 | (2006.01) |
| H01B 1/22 | (2006.01) |
| H01L 31/028 | (2006.01) |
| H01L 31/068 | (2012.01) |
| H01L 31/0236 | (2006.01) |
| H01L 31/0224 | (2006.01) |
| H01L 31/052 | (2014.01) |

(52) U.S. Cl.
CPC .... *H01L 31/0236* (2013.01); *H01L 31/022466* (2013.01); *H01L 31/022425* (2013.01); *Y02E 10/52* (2013.01); *H01L 31/0522* (2013.01); *H01L 31/028* (2013.01); *H01B 1/16* (2013.01); *Y02E 10/547* (2013.01); *H01B 1/08* (2013.01); *H01L 31/068* (2013.01); *H01B 1/22* (2013.01)
USPC .......................................... 136/256; 252/512

(58) Field of Classification Search
CPC .............. H01B 1/08; H01B 1/16; H01B 1/22; H01L 31/022425
USPC ......................................................... 136/256
See application file for complete search history.

(56) References Cited

U.S. PATENT DOCUMENTS

| | | | |
|---|---|---|---|
| 2003/0111106 A1* | 6/2003 | Nagano et al. ................. | 136/255 |
| 2006/0107991 A1* | 5/2006 | Baba ............................ | 136/244 |

(Continued)

FOREIGN PATENT DOCUMENTS

| | | |
|---|---|---|
| KR | 10-2003-0081662 A | 10/2003 |
| KR | 10-2009-0090843 A | 8/2009 |

(Continued)

OTHER PUBLICATIONS

Ida et al., "TiO2 coating on silica particles by deposition of sol-gel-derived nanoparticles", Advanced Powder Technol., vol. 18, No. 3, (2007), pp. 329-348.*

(Continued)

*Primary Examiner* — Jeffrey T Barton
*Assistant Examiner* — Tae-Sik Kang
(74) *Attorney, Agent, or Firm* — Birch, Stewart, Kolasch & Birch, LLP

(57) ABSTRACT

A solar cell is discussed. The solar cell includes a base substrate containing first impurities of a first conductive type and having a textured surface, an emitter layer that is positioned at the textured surface of the base substrate and contains second impurities of a second conductive type different from the first conductive type, and a front electrode electrically connected to the emitter layer. The front electrode collects carriers generated in the base substrate or the emitter layer. At least a portion of the front electrode transmits incident light from the outside.

11 Claims, 6 Drawing Sheets

(56) References Cited

U.S. PATENT DOCUMENTS

2008/0038529 A1* 2/2008 Nakayama et al. ........... 428/220
2009/0140218 A1* 6/2009 Inaba et al. .............. 252/519.31
2009/0260681 A1 10/2009 Yun et al.

FOREIGN PATENT DOCUMENTS

KR   10-2009-0091562 A   8/2009
KR   10-2010-0047291 A   5/2010

OTHER PUBLICATIONS

"Silicon Dioxide MSDS", [online], [retrieved on Apr. 5, 2013]. Retrieved from the Internet<URL: http://www.sigmaaldrich.com/MSDS/MSDS/DisplayMSDSPage.do?country=US&language=en&productNumber=83340&brand=SIAL&PageToGoToURL=http%3A%2F%2Fwww.sigmaaldrich.com%2Fcatalog%2Fproduct%2Fsial%2F83340%3Flang%3Den>, pp. 1-7.*

"Zinc Oxide MSDS", [online], [retrieved on Apr. 5, 2013]. Retrieved from the Internet<URL: http://www.sciencelab.com/msds.php?msdsId=9927329>, pp. 1-6.*

"Silver MSDS", [online], [retrieved on Apr. 5, 2013]. Retrieved from the Internet<URL: http://www.sciencelab.com/msds.php?msdsId=9927253>, pp. 1-5.*

"Polystyrene MSDS", [online], [retrieved on Apr. 9, 2013], Retrieved from the Internet<URL: http://terpconnect.umd.edu/~choi/MSDS/Sigma-Aldrich/POLYSTYRENE.pdf>, pp. 1-5.*

\* cited by examiner

FIG. 5

| Content percentage (%) | Light transmission | Electrical conductivity |
|---|---|---|
| 1 | × | ◎ |
| 2 | × | ◎ |
| 3 | × | ◎ |
| 4 | × | ◎ |
| 5 | △ | ◎ |
| 6 | △ | ◎ |
| 7 | △ | ◎ |
| 8 | △ | ◎ |
| 9 | △ | ◎ |
| 10 | ○ | ◎ |
| 11 | ○ | ◎ |
| 12 | ○ | ◎ |
| 13 | ○ | ◎ |
| 14 | ○ | ◎ |
| 15 | ◎ | ◎ |
| 16 | ◎ | ◎ |
| 17 | ◎ | ◎ |
| 18 | ◎ | ◎ |
| 19 | ◎ | ○ |
| 20 | ◎ | ○ |
| 21 | ◎ | ○ |
| 22 | ◎ | ○ |
| 23 | ◎ | ○ |
| 24 | ◎ | ○ |
| 25 | ◎ | ○ |
| 26 | ◎ | ○ |
| 27 | ◎ | △ |
| 28 | ◎ | △ |
| 29 | ◎ | △ |
| 30 | ◎ | △ |
| 31 | ◎ | × |
| 32 | ◎ | × |
| 33 | ◎ | × |

Bad: ×   Average: △   Good: ○   Excellent: ◎

PASTE AND SOLAR CELL USING THE SAME

This application claims priority to and the benefit of Korean Patent Application No. 10-2010-0047991 filed in the Korean Intellectual Property Office on May 24, 2010, the entire contents of which are incorporated herein by reference.

BACKGROUND OF THE INVENTION

1. Field of the Invention

Embodiments of the invention relate to a paste and a solar cell using the same.

2. Description of the Related Art

Recently, as existing energy sources such as petroleum and coal are expected to be depleted, interests in alternative energy sources for replacing the existing energy sources are increasing. Among the alternative energy sources, solar cells have been particularly spotlighted because, as cells for generating electric energy from solar energy, the solar cells are able to draw energy from an abundant source and do not cause environmental pollution.

A solar cell generally includes a substrate and an emitter layer, each of which is formed of a semiconductor, and electrodes respectively formed on the substrate and the emitter layer. The semiconductors forming the substrate and the emitter layer have different conductive types, such as a p-type and an n-type. A p-n junction is formed at an interface between the substrate and the emitter layer.

When light is incident on the solar cell, a plurality of electron-hole pairs are generated in the semiconductors. The electron-hole pairs are separated into electrons and holes by the photovoltaic effect. Thus, the separated electrons move to the n-type semiconductor (e.g., the emitter layer) and the separated holes move to the p-type semiconductor (e.g., the substrate), and then the electrons and holes are collected by the electrodes electrically connected to the emitter layer and the substrate, respectively. The electrodes are connected to each other using electric wires to thereby obtain electric power.

SUMMARY OF THE INVENTION

In one aspect, there is a solar cell including a base substrate containing first impurities of a first conductive type and having a textured surface, an emitter layer positioned at the textured surface of the base substrate, the emitter layer containing second impurities of a second conductive type different from the first conductive type, and a front electrode electrically connected to the emitter layer, the front electrode configured to collect carriers generated in the base substrate or the emitter layer, wherein at least a portion of the front electrode transmits incident light from the outside.

The front electrode may include a bead formed of an electrically conductive material with light transmission.

The bead may include a first portion containing a non-conductive material with light transmission and a second portion containing a conductive material with light transmission. The second portion may be formed on at least a portion of a surface of the first portion or on the entire surface of the first portion.

The non-conductive material with light transmission contained in the first portion may include a SiO2-based glass component and may not include a lead (Pb) component.

The conductive material with light transmission contained in the second portion may be a transparent conductive oxide (TCO)-based material. The TCO-based material may include at least one of ITO, ZnO, and SnO2.

A relative content percentage of beads among silver particles and the beads included in a paste forming the front electrode may be approximately 15% to 41%.

A shape of the bead may be at least one of a polyhedron, a sphere, or an ellipsoid. When the shape of the bead is the sphere, a diameter of the bead may be approximately 1 μm to 20 μm.

A thickness of the second portion of the bead may be approximately 8 nm to 100 nm.

The front electrode may include a finger electrode having a first width and a bus bar that is formed in a direction crossing the finger electrode and having a second width greater than the first width of the finger electrode. The finger electrode may include the bead. Alternatively, the finger electrode and the bus bar may include the bead.

In another aspect, there is a paste for forming an electrode of a solar cell including a metal particle that does not transmit light and has electrical conductivity and a bead that transmits light and has electrical conductivity.

The bead may include a first portion containing a non-conductive material with light transmission and a second portion containing a conductive material with light transmission. The second portion may be formed on at least a portion of a surface of the first portion or on the entire surface of the first portion.

The non-conductive material with light transmission contained in the first portion may include a SiO2-based glass component and may not include a lead (Pb) component.

The conductive material with light transmission contained in the second portion may be a transparent conductive oxide (TCO)-based material.

A content percentage of beads may be approximately 4% to 30%.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIG. 5 is a table illustrating electrical characteristics of a front electrode depending on a content percentage of glass beads in a paste for forming the front electrode.

DETAILED DESCRIPTION OF THE EMBODIMENTS

Figure 1:
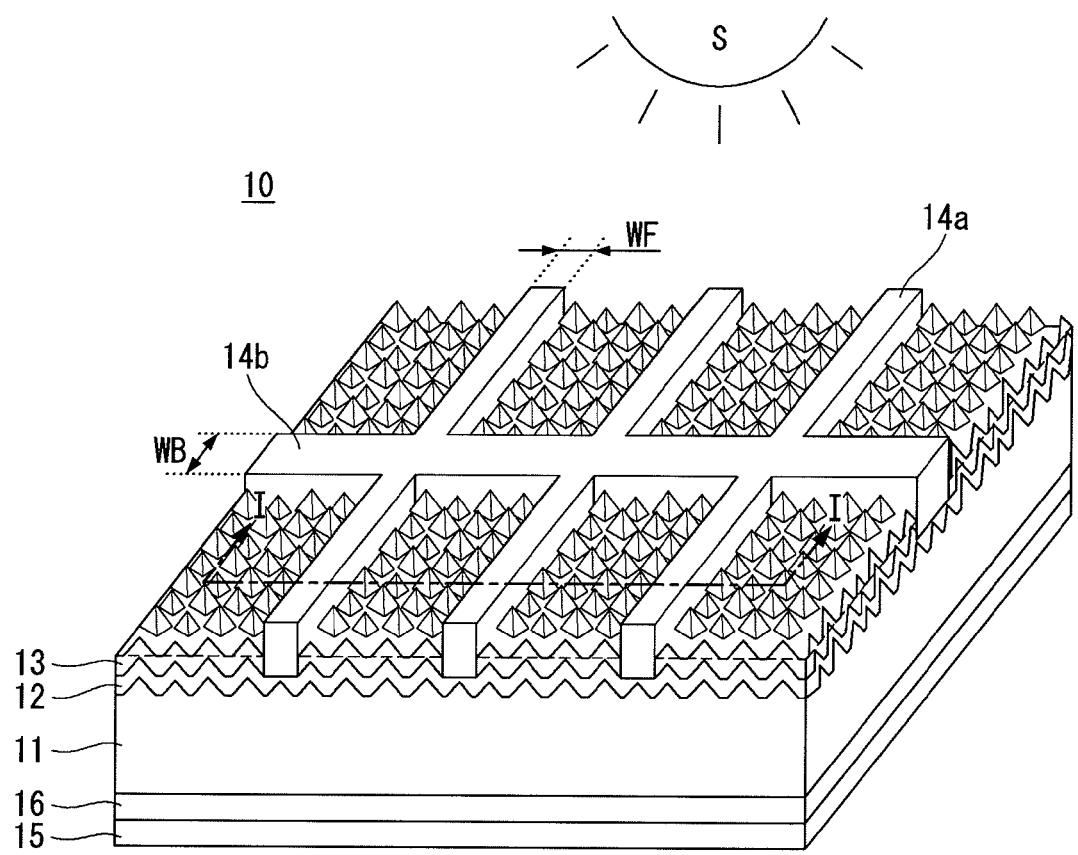
FIG. 1 illustrates a solar cell according to an example embodiment of the invention.

The invention will be described more fully hereinafter with reference to the accompanying drawings, in which example embodiments of the inventions are shown. This invention may, however, be embodied in many different forms and should not be construed as limited to the embodiments set forth herein.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, it will be understood that when an element such as a layer, film, region, or substrate is referred to as being "entirely" on another element, it may be on the entire surface of the other element and may not be on a portion of an edge of the other element.

Reference will now be made in detail to embodiments of the invention, examples of which are illustrated in the accompanying drawings.

FIG. 1 illustrates a solar cell according to an example embodiment of the invention.

As show in FIG. 1, a solar cell 10 according to an example embodiment of the invention includes a base substrate 11, an emitter layer 12 positioned at a light receiving surface (hereinafter, referred to as "a front surface") of the base substrate 11 on which light is incident, and front electrodes 14a and 14b electrically connected to the emitter layer 12. In addition, the solar cell 10 may further include an anti-reflection layer 13 positioned on the emitter layer 12, a back electrode 15 positioned on a back surface of the base substrate 11 opposite the front surface of the base substrate 11, and a back surface field (BSF) layer 16 positioned between the back electrode 15 and the base substrate 11.

The base substrate 11 may convert light energy coming from the outside into electric energy and may be a semiconductor substrate formed of first conductive type silicon, for example, p-type silicon, though not required. Silicon used in the base substrate 11 may be single crystal silicon, polycrystalline silicon or amorphous silicon. When the base substrate 11 is of a p-type, the base substrate 11 may contain impurities of a group III element such as boron (B), gallium (Ga), and indium (In). Alternatively, the base substrate 11 may be of an n-type. When the base substrate 11 is of the n-type, the base substrate 11 may contain impurities of a group V element such as phosphorus (P), arsenic (As), and antimony (Sb). Further, the base substrate 11 may be formed of semiconductor materials other than silicon.

The surface of the base substrate 11 is textured to form a textured surface corresponding to an uneven surface or having uneven characteristics. A light reflectance of the light receiving surface of the base substrate 11 is reduced because of the textured surface of the base substrate 11. Further, because both a light incident operation and a light reflection operation are performed on the textured surface of the base substrate 11, the light is confined in the solar cell 10. Hence, a light absorption of the solar cell 10 increases. In addition, because a reflection loss of light incident on the base substrate 11 is reduced, an amount of light incident on the base substrate 11 further increases. As a result, the efficiency of the solar cell 10 is improved.

The emitter layer 12 is positioned at the light receiving surface of the base substrate 11 on which light is incident. The emitter layer 12 may be of a second conductive type different from the first conductive type of the base substrate 11. For example, the emitter layer 12 is a region obtained by doping the base substrate 11 with impurities of the second conductive type (for example, an n-type) opposite the first conductive type of the base substrate 11. Thus, the emitter layer 12 of the second conductive type forms a p-n junction along with the base substrate 11 of the first conductive type. Because the emitter layer 12 is formed by diffusing impurities into the base substrate 11, the emitter layer 12 formed at the front surface of the base substrate 11 has a textured surface in the same manner as the base substrate 11.

A plurality of electron-hole pairs produced by light incident on the base substrate 11 are separated into electrons and holes by a built-in potential difference resulting from the p-n junction between the base substrate 11 and the emitter layer 12. Then, the separated electrons move to the n-type semiconductor, and the separated holes move to the p-type semiconductor. Thus, when the base substrate 11 is of the p-type and the emitter layer 12 is of the n-type, the separated holes move to the opposite side of the emitter layer 12 inside the base substrate 11, and the separated electrons move to the emitter layer 12.

Because the emitter layer 12 forms the p-n junction along with the base substrate 11, the emitter layer 12 may be of the p-type when the base substrate 11 is of the n-type unlike the embodiment described above. In this instance, the separated electrons move to the opposite side of the base substrate 11 from the emitter layer 12, and the separated holes move to the emitter layer 12.

Returning to the embodiment of the invention, when the emitter layer 12 is of the n-type, the emitter layer 12 may be formed by doping the base substrate 11 with impurities of a group V element such as phosphorus (P), arsenic (As), and antimony (Sb). Alternatively, when the emitter layer 12 is of the p-type, the emitter layer 12 may be formed by doping the base substrate 11 with impurities of a group III element such as boron (B), gallium (Ga), and indium (In).

The anti-reflection layer 13 reduces a reflectance of light incident on the solar cell 10 and increases selectivity of a predetermined wavelength band, thereby increasing the efficiency of the solar cell 10. The anti-reflection layer 13 is positioned on the emitter layer 12, on which the front electrodes 14a and 14b are not positioned, and allows an incident amount of light from the outside on the base substrate 11 to increase. The anti-reflection layer 13 may be formed of silicon nitride (SiNx) and/or silicon oxide ($SiO_x$) and may have a thickness of about 70 nm to 80 nm. The anti-reflection layer 13 may be omitted, if desired.

The front electrodes 14a and 14b collect carriers, i.e., electrons or holes generated in the base substrate 11 or the emitter layer 12 and output the carriers to an external device. The front electrodes 14a and 14b may include a plurality of finger electrodes 14a each having a width WF and a bus bar 14b that is formed in a direction crossing the finger electrodes 14a and has a width WB greater than the width WF of the finger electrode 14a.

The finger electrodes 14a are formed on the emitter layer 12 and are electrically connected to the emitter layer 12. The finger electrodes 14a are spaced apart from one another and extend in one direction. Each of the finger electrodes 14a collects carriers (for example, electrons) moving to the emitter layer 12 and transfers the carriers to the bus bar 14b.

The finger electrodes 14a contain at least one conductive material, for example, silver (Ag). Instead of silver (Ag), the finger electrodes 14a may be formed of at least one selected from the group consisting of nickel (Ni), copper (Cu), aluminum (Al), tin (Sn), zinc (Zn), indium (In), titanium (Ti), gold (Au), and a combination thereof. Other conductive materials may be used.

The bus bar 14b is formed on the emitter layer 12 in the direction crossing the finger electrodes 14a. Thus, the finger electrodes 14a and the bus bar 14b are disposed on the emitter layer 12 in the crossing form. A width ratio of the bus bar 14b to the finger electrode 14a may be approximately 5:1 to 20:1. For example, when the width of the bus bar 14b is approximately 1,500 μm, the width of the finger electrode 14a may be approximately 100 μm.

Alternatively, at least one bus bar 14b may be formed on the emitter layer 12 in the direction crossing the finger electrodes 14a. The at least one bus bar 14b may be formed of at least one conductive material. Examples of the conductive material include at least one selected from the group consisting of nickel (Ni), copper (Cu), silver (Ag), aluminum (Al), tin (Sn), zinc (Zn), indium (In), titanium (Ti), gold (Au), and a combination thereof. Other conductive materials may be used. The at least one bus bar 14b is electrically connected to the emitter layer 12 and the finger electrodes 14a. Thus, the at least one bus bar 14b outputs the carriers (for example, electrons) transferred from the finger electrodes 14a to the external device.

The finger electrodes 14a and the bus bar 14b may be electrically connected to the emitter layer 12 in a process in which the conductive metal material is applied to the anti-reflection layer 13, is patterned in a form illustrated in FIG. 1, and is fired.

In the embodiment of the invention, at least a portion of each of the front electrodes 14a and 14b may transmit light from the outside. Thus, the base substrate 11 or the emitter layer 12, on which the front electrodes 14a and 14b are formed, may receive the light from the outside, thereby generating the plurality of electron-hole pairs. As a result, the electricity generation efficiency of the solar cell 10 may be improved. Details of such improvements will be described later.

The back electrode 15 is formed on the entire surface (i.e., the entire back surface of the base substrate 11) opposite the light receiving surface of the base substrate 11. The back electrode 15 collects carriers (for example, holes) moving to the base substrate 11 and output the carriers to the external device.

The back electrode 15 may be formed of at least one conductive material, for example, silver (Ag) in the same manner as the front electrodes 14a and 14b. Alternatively, the back electrode 15 may be formed of aluminum (Al) in consideration of manufacturing cost. Instead of aluminum (Al), the back electrode 15 may be formed of at least one selected from the group consisting of nickel (Ni), copper (Cu), tin (Sn), zinc (Zn), indium (In), titanium (Ti), gold (Au), and a combination thereof. Other conductive materials may be used. The back electrode 15 is electrically connected to the base substrate 11.

The back surface field layer 16 is positioned between the back electrode 15 and the base substrate 11. The back surface field layer 16 is a region (for example, a $p^+$-type region) obtained by more heavily doping the back surface of the base substrate 11 with impurities of the same conductive type as the base substrate 11 than the base substrate 11.

The movement of carriers (for example, electrons) around the back surface of the base substrate 11 is prevented or reduced by a potential barrier resulting from a difference between impurity concentrations of the base substrate 11 and the back surface field layer 16. Thus, a recombination and/or a disappearance of electrons and holes around the back surface of the base substrate 11 are prevented or reduced. As a result, the electricity generation efficiency of the solar cell 10 may be improved.

An operation of the solar cell 10 having the above-described configuration is described below.

When light irradiated to the solar cell 10 is incident on the base substrate 11 through the anti-reflection layer 13 and the emitter layer 12, a plurality of electron-hole pairs are generated in the base substrate 11 by the photoelectric effect. The electron-hole pairs are separated into electrons and holes by the p-n junction between the base substrate 11 and the emitter layer 12. Then, the separated electrons move to the n-type emitter layer 12, and the separated holes move to the p-type base substrate 11. The electrons moving to the n-type emitter layer 12 are collected by the finger electrode 14a or the bus bar 14b and move to the external device. The holes moving to the p-type base substrate 11 are collected by the back electrode 16 and move to the external device. When the front electrodes 14a and 14b are connected to the back electrode 15 using electric wires, current flows therein to thereby enable use of the current for electric power.

Although the above-described solar cell 10 may be individually used, the plurality of solar cells 10 having the same structure may be electrically connected in series or in parallel to one another to form a solar cell module for more efficient use of the solar cells 10.

A structure and a principle of a solar cell according to embodiments of the invention, in which at least a portion of each of the front electrodes 14a and 14b can transmit light, are described with reference to FIGS. 2 to 6.

Figure 2:
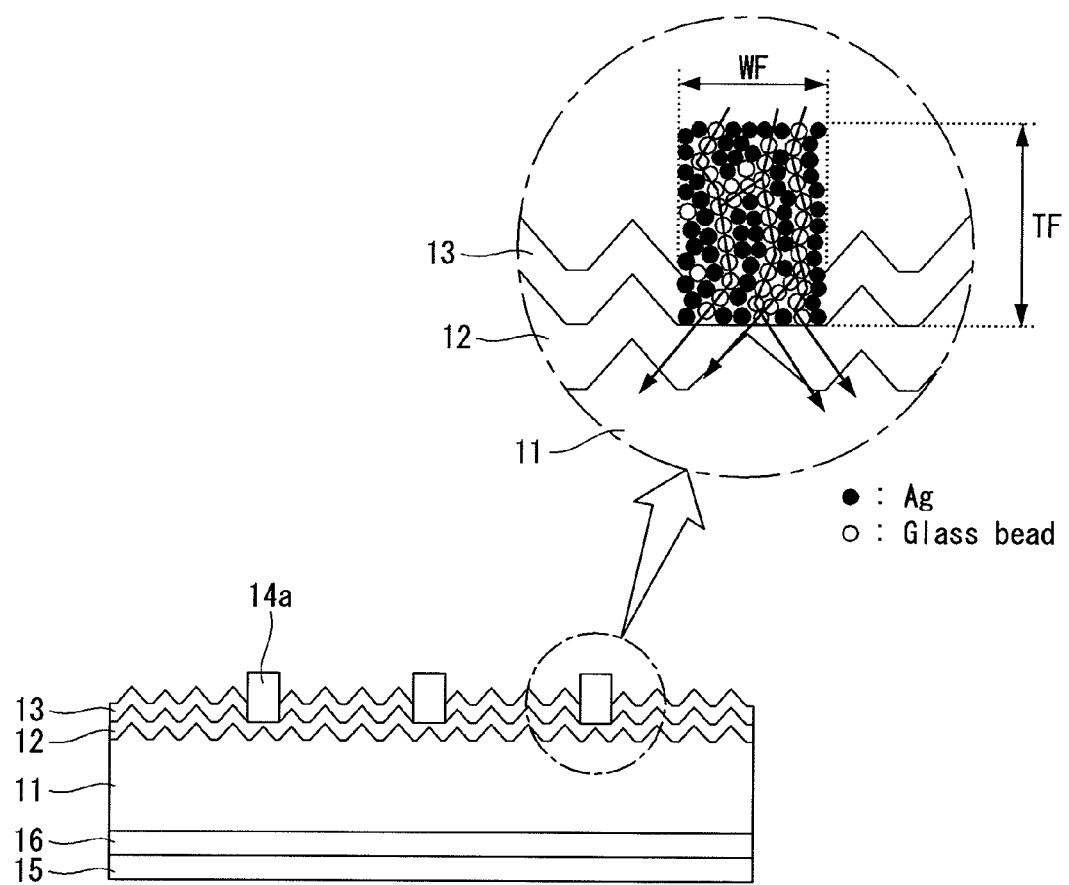
FIG. 2 is a cross-sectional view taken along line I-I of FIG. 1.

FIG. 2 is a cross-sectional view taken along line I-I of FIG. 1. More specifically, FIG. 2 illustrates a structure and a principle of an example embodiment of the invention in which at least a portion of each of the front electrodes 14a and 14b can transmit light.

As shown in FIG. 2, because the finger electrode 14a among the front electrodes 14a and 14b includes an electrically conductive material with (or enabling) light transmission by being transparent or translucent, for example, glass beads, at least a portion of the finger electrode 14a may transmit light. The width WF of the finger electrode 14a may be approximately 50 μm to 150 μm, and a thickness TF of the finger electrode 14a may be approximately 15 μm to 35 μm. In embodiments of the invention, with FIG. 2 showing an example, the glass beads may form one or more channels for light to internally transit the front electrodes 14a and 14b.

More specifically, a paste used to form the finger electrode 14a may include silver (Ag) particles, a glass fit, a vehicle, and glass beads. Other additives may be used for the paste of the finger electrode 14a.

FIG. 2 illustrates only the silver particles and the glass beads among the materials included in the paste for forming the finger electrode 14a for the sake of brevity. Namely, other materials other than the silver particles and the glass beads are not illustrated in FIG. 2 for the sake of brevity. Further, FIG. 2 illustrates only the finger electrode 14a including the electrically conductive material with light transmission, for example, the glass beads. However, the bus bar 14b may include similarly include such glass beads.

The silver particles do not transmit light, but has the electrical conductivity. Thus, the silver particles may improve the electrical conductivity of the finger electrode 14a. The silver particles include silver particles recrystallized by reacting on silicon contained in the emitter layer 12 at a contact surface between the finger electrode 14a and the emitter layer 12 in a firing process, and non-recrystallized silver particles included in the paste at a non-contact surface between the finger electrode 14a and the emitter layer 12. The silver particles recrystallized at the contact surface between the finger electrode 14a and the emitter layer 12 mostly exist in the paste. A diameter of each of the recrystallized silver particles may be approximately 300 nm to 700 nm, and a diameter of each of the silver particles included in the paste may be approximately 2 μm to 5 μm.

The glass fit is a mixture of PbO, $B_2O_3$, and $SiO_2$ and has a melting point of about 450° C. to 500° C. The glass frit is melted in the firing process, thereby penetrating the anti-reflection layer 13 into the emitter layer 12. Hence, the glass frit may help the recrystallization of the silver particles at the contact surface between the finger electrode 14a and the emitter layer 12.

The vehicle may serve as a solvent for mixing well the silver particles, the glass frit, and the glass beads. Further, the vehicle may serve as a binder for increasing a bonding strength between the silver particles, the glass frit, and the glass beads after they are mixed well. The vehicle may be a paint including a pigment. More specifically, the vehicle may be a liquid component used to adhere a pigment of a solid component to a painted surface and form a painting layer.

The glass beads, i.e., the electrically conductive material with light transmission may include a non-conductive material with light transmission therein and an electrically conductive material with light transmission on the surface thereof. Because the glass beads do not contain lead (Pb) component, a melting point of the glass beads is higher than the melting point of the glass frit. For example, the melting point of the glass beads is approximately 1,000° C. to 1,400° C. Because the glass beads are not melted in the firing process, the form of the glass beads remains without change after the firing process.

Accordingly, as shown in FIG. 2, the glass beads are positioned between the silver particles after the firing process. Even when light is incident on the finger electrodes 14a of the solar cell 10, the light is refracted and reflected inside the glass beads. Hence, the light may be incident on the emitter layer 12 or the base substrate 11 underlying the finger electrodes 14a through the glass beads. As a result, the electricity generation efficiency of the solar cell 10 is further improved.

The glass beads are described below in detail with reference to FIG. 3.

Figure 3:
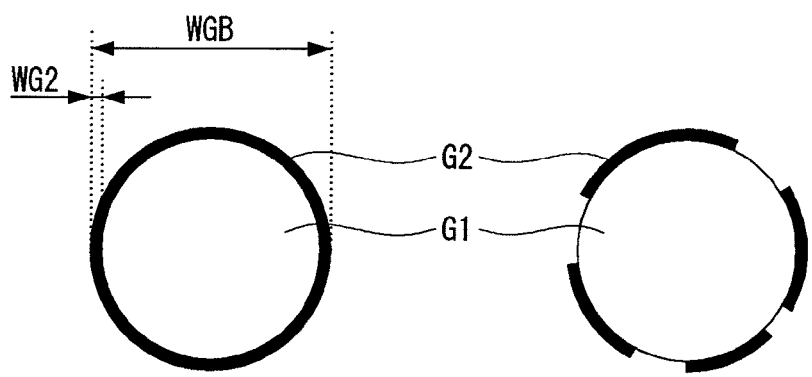
FIG. 3 illustrates a glass bead according to an example embodiment of the invention.

FIG. 3 illustrates the glass bead according to the example embodiment of the invention.

As shown in FIG. 3, each of the glass beads may include a first portion G1 corresponding to an inner space of the glass bead and a second portion G2 corresponding to a surface of the glass bead.

The first portion G1 of the glass bead may contain a non-conductive material with light transmission, so that at least a portion of each of the front electrodes 14a and 14b can transmit light. The non-conductive material with light transmission of the first portion G1 may include $SiO_2$-based glass component and does not include lead (Pb) component. Thus, because the glass bead does not include lead (Pb) component, the melting point of the glass bead may relatively increase. After the firing process, the form of the glass bead may remain without the change. Further, when light is incident on the front electrodes 14a and 14b of the solar cell 10, the light is refracted and reflected inside the glass beads. Hence, the light may be incident on the emitter layer 12 or the base substrate 11 underlying the finger electrodes 14a through the glass beads. In other embodiments, the non-conductive material with light transmission of the first portion G1 may be other types of glass.

The second portion G2 of the glass bead may contain an electrically conductive material with light transmission. As shown in FIG. 3, the second portion G2 may be formed on a surface of at least a portion of the first portion G1 or on the entire surface of the first portion G1. It may be preferable, but not required, that the second portion G2 is formed on the entire surface of the first portion G1 in consideration of the electrical conductivity of the glass bead. However, even if the second portion G2 is formed on the surface of at least a portion of the first portion G1, the entire electrical conductivity of the front electrodes 14a and 14b is not greatly reduced because of the silver particles included in the paste. Further, if the entire electrical conductivity of the front electrodes 14a and 14b is not greatly reduced, the second portion G2 may be omitted.

The electrically conductive material with light transmission of the second portion G2 may be a transparent conductive oxide (TCO)-based material. For example, the TCO-based material may include at least one of ITO, ZnO, and $SnO_2$.

The second portion G2 may allow at least a portion of each of the front electrodes 14a and 14b to transmit light and may improve the electrical conductivity of the front electrodes 14a and 14b.

A diameter WGB of the glass bead may be approximately 1 μm to 20 μm. A minimum diameter (i.e., about 1 μm) of the glass bead may be determined in consideration of transmission characteristic of light and the silver particles each having the diameter of about 2 μm to 5 μm. When the diameter of the glass bead is less than approximately 1 μm, the transmission characteristic of light may be greatly reduced. However, if the diameter of the silver particle is less than the above diameter range, the glass bead may have the diameter less than about 1 μm. If the entire glass bead including the inner space and the surface is formed of the electrically conductive material with light transmission, the diameter WGB of the glass bead may less than about 1 μm. In this instance, an amount of the glass beads may be more than an amount of silver particles contained in the front electrodes 14a and 14b. Hence, the silver particles may be omitted in the paste for forming the front electrodes 14a and 14b. In this instance, because the entire front electrodes 14a and 14b can transmit light, the efficiency of the solar cell 10 may be improved.

Further, a maximum diameter (i.e., about 20 μm) of the glass bead may be determined in consideration of the width and the thickness of the finger electrode 14a. When the diameter of the glass bead is greater than about 20 μm, the light transmission characteristic may be improved because of an increase in the occupation area of the glass beads in the finger electrode 14a. However, the electrical conductivity of the finger electrode 14a may be reduced in consideration of the width and the thickness of the finger electrode 14a and the non-conductive glass component of the glass beads. However, the diameter of the glass bead in the bus bar 14b may be greater than about 20 μm. Further, if the entire glass bead including the inner space and the surface is formed of the electrically conductive material with light transmission, the diameter WGB of the glass bead may be greater than about 20 μm.

The second portion G2 of the glass bead may be formed using a sputtering method. A thickness of the second portion G2 formed using the sputtering method may be approximately 8 nm 100 nm.

A maximum thickness (i.e., approximately 100 nm) of the second portion G2 may be determined in consideration of the relatively expensive TCO-based material forming the second portion G2. Thus, when the thickness of the second portion G2 is equal to or less than approximately 100 nm, the production cost of the second portion G2 may be minimized while sufficiently maintaining the electrical conductivity of the second portion G2.

When the thickness of the second portion G2 is equal to or greater than approximately 8 nm, the minimum electrically conductivity of the TCO-based material may be maintained without reducing the electricity generation efficiency of the solar cell 10.

FIG. 3 illustrates the glass bead including both the first portion G1 and the second portion G2. However, the glass bead may include only the first portion G1 or only the second portion G2. Further, FIG. 3 illustrates a circular or spherical glass bead. However, the shape of the glass bead may be at least one of a polygon, a circle, an oval, a rectangle, a square, or may be a sphere, an ellipsoid, or a polyhedron, such as a pyramid, a cube, or other multisided structure, such as a dodecahedron. In such cases, the sides of the polyhedron may be from 4 to about 100, or more, and may have surfaces that are substantially flat, flat, curved, or a combination thereof. Further, the shape of the glass bead may be irregular, may even be particles, and may have a one or more apexes.

Figure 4:
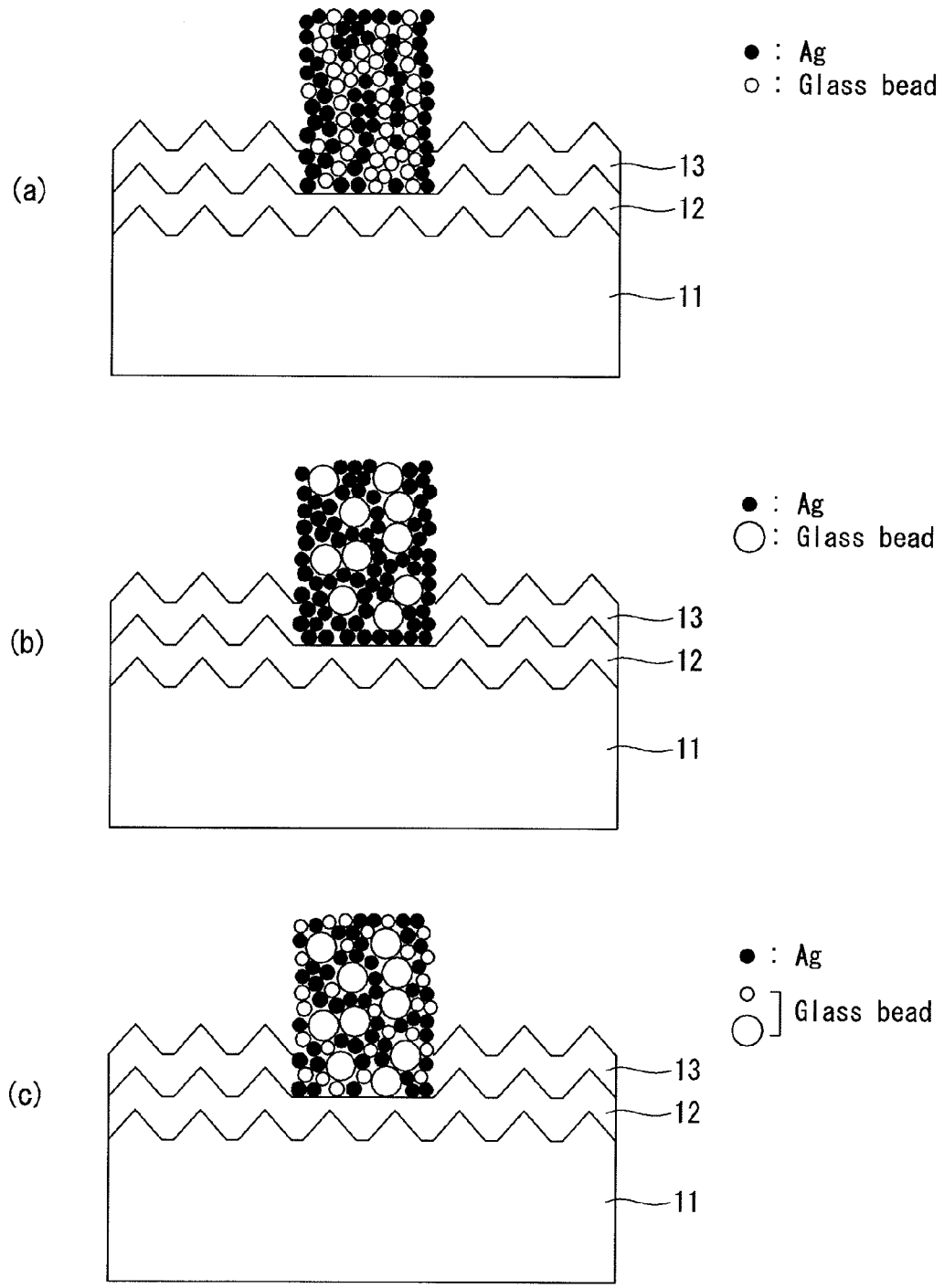
FIG. 4 illustrates various sizes of glass beads used with silver particles in a solar cell.

FIG. 4 illustrates various sizes of the glass beads each including the first portion G1 and the second portion G2 and the silver particles.

As shown in (a) of FIG. 4, the size of each of the glass beads included in the front electrodes 14a and 14b may be substantially equal to the size of each of the silver particles. As shown in (b) of FIG. 4, the size of each of the glass beads included in the front electrodes 14a and 14b may be greater than the size of each of the silver particles. As shown in FIG. (c) of 4, the glass beads included in the front electrodes 14a and 14b may have various sizes.

The size of each of the glass beads illustrated in FIG. 4 may be approximately 1 μm to 20 μm.

FIG. 5 is a table illustrating the electrical characteristics of the front electrodes 14a and 14b depending on a content percentage of the glass beads in the paste for forming the front electrodes 14a and 14b. In the Table illustrated in FIG. 5, each of the glass beads includes the first portion G1 formed of the non-conductive material with light transmission and the second portion G2 formed of the electrically conductive material with light transmission.

In the Table illustrated in FIG. 5, a content percentage is expressed by a percentage of an amount of the glass beads contained in the paste (for example, by weight or volume) for forming the front electrodes 14a and 14b, the light transmission is expressed by an amount of light transmitted by the front electrodes 14a and 14b depending on the content percentage of the glass beads in the paste, and the electrical conductivity of the front electrodes 14a and 14b is expressed depending on the content percentage of the glass beads in the paste.

As shown in FIG. 5, when the content percentage of the glass beads in the paste included in a unit area of the front electrodes 14a and 14b is about 1% to 4%, the light transmission characteristic of the front electrodes 14a and 14b is bad and the electrical conductivity characteristic of the front electrodes 14a and 14b is excellent. When the content percentage of the glass beads is about 5% to 9%, the light transmission characteristic of the front electrodes 14a and 14b is average and the electrical conductivity characteristic of the front electrodes 14a and 14b is excellent.

Further, when the content percentage of the glass beads is about 10% to 14%, the light transmission characteristic of the front electrodes 14a and 14b is good and the electrical conductivity characteristic of the front electrodes 14a and 14b is excellent. When the content percentage of the glass beads is about 15% to 18%, the light transmission characteristic and the electrical conductivity characteristic of the front electrodes 14a and 14b are excellent.

Further, when the content percentage of the glass beads is about 19% to 26%, the light transmission characteristic of the front electrodes 14a and 14b is excellent and the electrical conductivity characteristic of the front electrodes 14a and 14b is good. When the content percentage of the glass beads is about 27% to 30%, the light transmission characteristic of the front electrodes 14a and 14b is excellent and the electrical conductivity characteristic of the front electrodes 14a and 14b is average. When the content percentage of the glass beads is about 31% to 33%, the light transmission characteristic of the front electrodes 14a and 14b is excellent and the electrical conductivity characteristic of the front electrodes 14a and 14b is bad.

Accordingly, it may be preferable, but not required, that the content percentage of the glass beads in the paste for forming the front electrodes 14a and 14b is 5% to 30%.

However, unlike the glass beads each including the first portion G1 formed of the non-conductive material with light transmission and the second portion G2 formed of the electrically conductive material with light transmission, if each of the glass beads includes only the first portion G1 or only the second portion G2, the content percentage of the glass beads may be different from the above content percentage range.

More specifically, a metal material among the materials for forming the front electrodes 14a and 14b forms a majority content and most affects the electrical conductivity. Because the metal material generally used in the front electrodes 14a and 14b is the silver particles, the electricity generation efficiency of the solar cell 10 depending on the content percentage (i.e., a relative content percentage) of the glass beads among the silver particles and the glass beads included in the paste is illustrated in FIG. 6.

In FIG. 6, the relative content percentage, the light transmission, and the electrical conductivity are described above, and the effect illustrated in FIG. 6 is obtained using the same glass beads as FIG. 5.

After the front electrodes 14a and 14b are formed using the paste, an organic material is removed from the paste and is hardened through a thermal processing. Therefore, the content percentage of the glass beads in the front electrodes 14a and 14b thus formed is expressed by a relative percentage of an occupation amount of the glass beads among the silver particles and the glass beads included in the front electrodes 14a and 14b.

Figure 6:
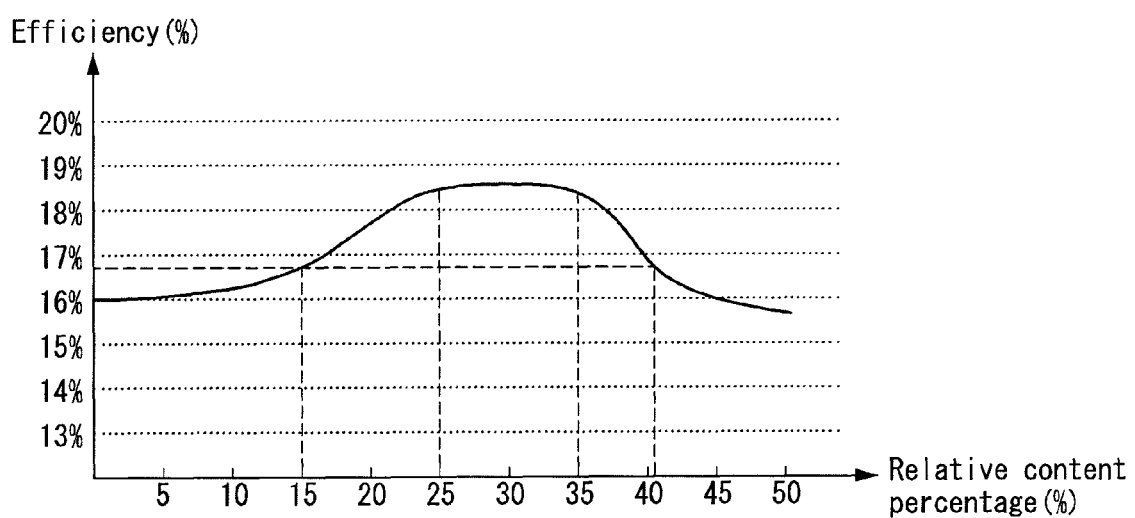
FIG. 6 is a graph illustrating electrical characteristics depending on a relative content percentage of glass beads based on silver particles included in a paste.

As shown in FIG. 6, when the content percentage (i.e., the relative content percentage) of the glass beads among the silver particles and the glass beads included in the paste is equal to or less than about 14%, the light transmission and the electrical conductivity are scarcely affected by the relative content percentage. Hence, the efficiency of the solar cell 10 is about 16% to 16.5%. When the relative content percentage is about 15% to 25%, the electrical conductivity is scarcely affected by the relative content percentage but the light transmission may change to be good. Hence, the efficiency of the solar cell 10 gradually increases from about 16.5% to 18.5%.

When the relative content percentage is about 25% to 35%, the electrical conductivity and the light transmission may improve. Hence, the efficiency of the solar cell 10 may be about 18.5%.

When the relative content percentage is about 35% to 41%, the light transmission may change to be better and the electrical conductivity may be reduced. Hence, the efficiency of the solar cell 10 may decrease from about 18.5% to 16.6%.

When the relative content percentage is equal to or greater than about 41%, the light transmission may be better and the electrical conductivity may be further reduced. Hence, the efficiency of the solar cell 10 may decrease to be equal to or less than about 16.5%.

Accordingly, in the glass beads each including the first portion G1 formed of the non-conductive material with light transmission and the second portion G2 formed of the electrically conductive material with light transmission, when the content percentage of the glass beads is very large, the light transmission is excellent, but the electrical conductivity is less than the silver particles because of the characteristics of the glass beads including the first portion G1 and the second portion G2.

Accordingly, it may be preferable, but not required, that the relative content percentage of an occupation amount of the glass beads among the silver particles and the glass beads included in the paste forming the front electrodes 14a and 14b is about 15% to 41%.

However, when each of the glass beads includes only the first portion G1 formed of the non-conductive material with light transmission or only the second portion G2 formed of the electrically conductive material with light transmission, the relative content percentage of the glass beads may be different from the above relative content percentage range.

Additionally, although most of the description involved glass beads, in other embodiments of the invention, the beads need not be glass, and may be other materials as long as the materials have transparent or translucent characteristics. Additionally, although most of the description involved the first portion G1 being formed of the non-conductive material with light transmission and the second portion G2 being formed of the conductive material with light transmission, in other embodiments, the first portion G1 may be formed of conductive materials that have transparent or translucent characteristics, and the second portion G2 may be an electrically conductive material without light transmission. For example, the first portion G1 may be TCO and the second portion G2 may be silver or other metals. Further, in other embodiments of the invention, at least one of the finger electrodes 14a and the bus bar 14b may include various types of beads, including beads having the first portion G1 of non-conductive material such as glass, beads having the first portion G1 of conductive material such as TCO, or a combination of such two different types of beads.

As described above, in the solar cell according to the embodiment of the invention, because at least a portion of the front electrode can transmit incident light, the electricity generation efficiency of the solar cell is improved. Furthermore, because the glass beads which are more inexpensive than the silver particles are used to form the front electrode instead of the silver particles, the manufacturing cost is reduced.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A solar cell comprising:
a base substrate containing first impurities of a first conductive type and having a textured surface;
an emitter layer positioned at the textured surface of the base substrate, the emitter layer containing second impurities of a second conductive type different from the first conductive type; and
a front electrode electrically connected to the emitter layer, the front electrode configured to collect carriers generated in the base substrate or the emitter layer,
wherein the front electrode includes a plurality of metal particles that do not transmit light and have electrical conductivity and a plurality of beads that transmit light and have electrical conductivity,
wherein each bead of the plurality of beads includes a first portion containing a non-conductive material with light transmission and a second portion containing a conductive material with light transmission,
wherein the second portion is coated on at least a portion of a surface of the first portion or on the entire surface of the first portion, and
wherein a content percentage of the plurality of beads among the plurality of metal particles and the plurality of beads in the front electrode is 15% to 41%.

2. The solar cell of claim 1, wherein the non-conductive material with light transmission contained in the first portion includes a $SiO_2$-based glass component and does not include a lead (Pb) component.

3. The solar cell of claim 1, wherein the conductive material with light transmission contained in the second portion is a transparent conductive oxide (TCO)-based material.

4. The solar cell of claim 3, wherein the TCO-based material includes at least one of indium tin oxide (ITO), ZnO, and $SnO_2$.

5. The solar cell of claim 1, wherein a shape of the each bead is at least one of a polyhedron, a sphere, or an ellipsoid.

6. The solar cell of claim 5, wherein when the shape of the each bead is the sphere, a diameter of the each bead is approximately 1 µm to 20 µm.

7. The solar cell of claim 1, wherein a thickness of the second portion of the each bead is approximately 8 nm to 100 nm.

8. The solar cell of claim 1, wherein the front electrode includes a finger electrode having a first width and a bus bar that is formed in a direction crossing the finger electrode and having a second width greater than the first width of the finger electrode, and
the finger electrode includes the plurality of beads.

9. The solar cell of claim 8, wherein the finger electrode and the bus bar include the plurality of beads.

10. The solar cell of claim 1, wherein a melting point of the each bead is higher than melting points of other materials included in the front electrode.

11. The solar cell of claim 1, wherein the plurality of beads form one or more channels for the incident light to internally transit the front electrode.

* * * * *